United States Patent [19]

Gill et al.

[11] Patent Number: 4,963,924
[45] Date of Patent: Oct. 16, 1990

[54] LINEWIDTH LOSS MEASUREMENT

[75] Inventors: Michael D. Gill, Ipswich; David W. J. Blackburn, Bury St. Edmunds; Malcolm P. Saunders, Ipswich, all of England

[73] Assignee: British Telecommunications plc, London, England

[21] Appl. No.: 348,530

[22] Filed: May 8, 1989

[30] Foreign Application Priority Data

May 17, 1988 [GB] United Kingdom ............... 8811678

[51] Int. Cl.$^5$ ............................................. G03B 27/32
[52] U.S. Cl. ......................................... 355/77; 355/53
[58] Field of Search ........................... 355/77, 53, 133; 156/626; 324/158 R

[56] References Cited

U.S. PATENT DOCUMENTS

| 4,475,811 | 10/1984 | Brunner | 324/158 R |
| 4,538,105 | 8/1985 | Ausschnitt | 324/158 R |
| 4,860,062 | 8/1989 | Parks | 355/77 |
| 4,863,548 | 9/1989 | Lee | 156/626 |

FOREIGN PATENT DOCUMENTS 3305977 8/1984 Fed. Rep. of Germany .

OTHER PUBLICATIONS

Patent Abstracts of Japan, vol. 5, No. 73 (P-61)[745], 15th May 1981; and JP-A-56 21 125 (Fujitsu K. K.) 27-02-1981.

Primary Examiner—Monroe H. Hayes
Attorney, Agent, or Firm—Nixon & Vanderhye

[57] ABSTRACT

A method of measuring linewidth loss during the formation of microelectronic circuitry, including the formation of a test pattern constituted by a series of spaced bars on a photographic mask which is to be used to form a predetermined pattern on a substrate material. Either of the bars or the gaps between the bars have the same predetermined width. In the former case the gaps, and in the latter case the bars, have widths which differ incrementally stepwise from one to the next. The series of bars are such that the ratio of the widths of one adjacent bar/gap pair is unity.

The resultant pattern which is formed on the substrate as a complement of the test pattern is then inspected, and the position where the bar/gap width ratio of the resultant pattern is unity is noted. The linewidth can then be calculated loss from a knowledge of the size of the incremental step and the position of the bar/gap width ratio unity point on the resultant pattern.

5 Claims, 1 Drawing Sheet

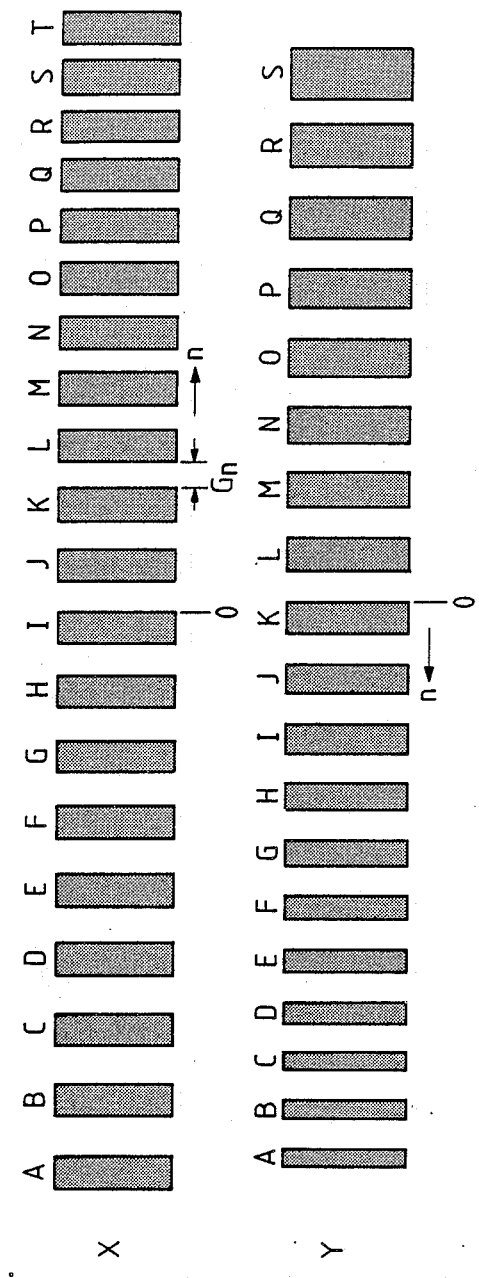
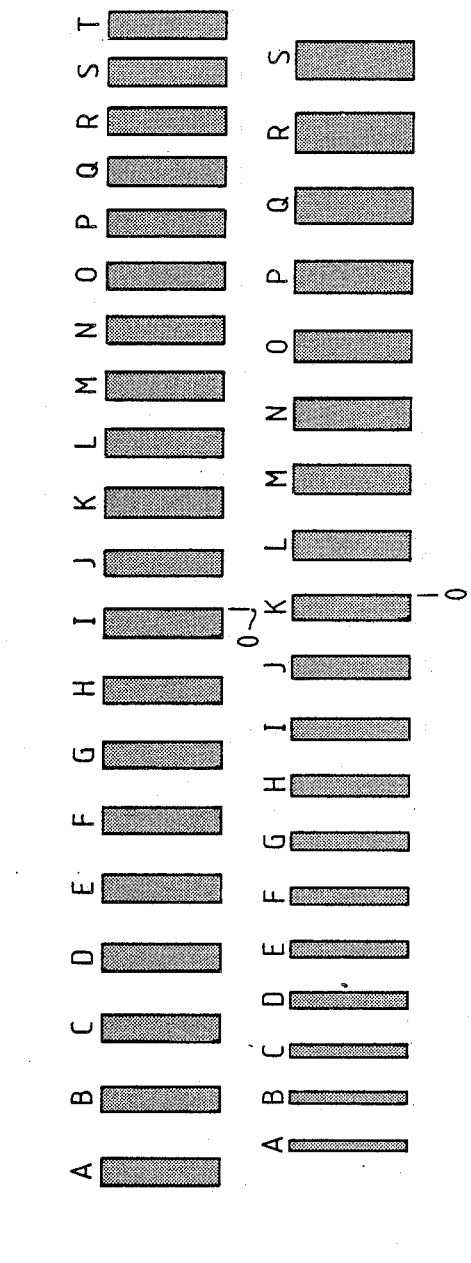
Fig.1.
Fig.2.

LINEWIDTH LOSS MEASUREMENT

This invention relates to a method of measuring linewidth loss during the formation of microelectronic circuitry.

It is well known that many components of microelectronic circuitry can be formed by etching a semiconductor substrate. In order to etch a required pattern in such a substrate, a photo-resist is applied to the substrate, and the photo-resist is then exposed to ultraviolet light through a photographic mask and then developed to reproduce the mask pattern in the resist. The photo-resist then acts as a mask for subsequent etching of the substrate. Both the steps of producing the resist pattern and of etching are subject to linewidth errors, and in particular to linewidth loss. Thus, although linewidth gain is theoretically possible for either or both of these processes, in practice linewidth loss is likely to be the major problem. Obviously, where loss occurs for both processes, a cumulative loss results, and this can be extremely disadvantageous in some applications. Thus, for certain processes, such as the formation of polysilicon gates and the etching of contacts and metal interconnects, linewidth loss must be kept below predetermined limits. This entails optical measurement of linewidth after both process steps, that is to say after the photolithography and after the etching process itself. Thus, if an unacceptable linewidth loss occurs, the process steps can be modified to reduce this loss. For example, total linewidthh loss can be reduced by adjusting the exposure time for the photolith process, in order to result in an increase in the linewidth of the resist pattern.

One known method of optically measuring linewidth is to use an image shearing optical microscope. Such a microscope splits the image of a line into two, and the movement required to butt the two images is a measure of the linewidth. The measurement is subjective and time consuming.

Another known method is to use an automatic intensity profiling system. This entails measuring the intensity variation across a line of the light reflected from the substrate. Here again, the method is time consuming, and is not reliable for all tyoes of substrate. A further disadvantage is that a scanning electron microscope is needed for calibration purposes.

The aim of the invention is to provide a method of measuring linewidth loss which is quicker and easier to carry out than known methods, and which can be used for all types of substrate including metal, oxide or polysilicon.

The present invention provides a method of measuring linewidth loss during the formation of microelectronic circuitry, the method comprising the steps of:

(a) forming a test pattern constituted by a series of spaced bar on a photographic mask which is to be used to form a predetermined pattern on a substrate material, one of the bars or the gaps between the bars having the same predetermined width, and the other of the bars or the gaps having widths which differ incrementally stepwise from one to the next, the series of bars being such that the ratio of the widths of one adjacent bar/gap pair is unity;

(b) inspecting the resultant patter which is formed on the substrate as a complement of the test pattern;

(c) noting the position where the bar/gap width ratio of the resultant pattern is unity; and (d) calculating the linewidth loss from a knowledge of the size of the incremental step and the position of the bar/gap width ratio unity point on the resultant pattern.

In a preferred embodiment, the test pattern is constituted by first and second series of spaced bars, the bars of the first series having the same width, and the gaps between the bars of the second series having the same width.

Advantageously, the line width loss (L) is calculated using the formula $L=nd/2$ where d is the incremental step by which the bars or gaps differ and n is the number of bars between the unity point of the bar/gap width ratio of the test pattern and the unity point of the bar/gap width ratio of the resultant pattern.

The invention will now be described in greater detail, by way of example, with reference to the accompanying drawings, in which:

FIG. 1 shows, on an enlarged scale, a test pattern applied to a mask; and

FIG. 2 shows, on an enlarged scale, the resultant pattern formed on a substrate after photolith and etching processes.

Referring to the drawings, FIG. 1 shows a test pattern which is applied to a photographic mask (not shown) which is to be used to form a desired pattern on a substrate material. Conveniently, the test pattern is positioned at an edge portion of the mask or in any part thereof which is free of other patterning. The test pattern is constituted by upper and lower series X and Y of spaced bars. In the upper series X, the bars A to T all have the same width of $W^1=1$ μm, but the gaps $G^1$ between adjacent pairs of bars decrease in width from left to right by increments $g=0.05$ μm. In the lower series Y, the bars A to S have widths $W^2$ which increase from left to right by increments $w=0.05$ μm, but the gaps $G^2$ all have the same width of 1 μm. In each series X and Y, the bars are arranged in such a manner that the ratio of bar to gap width equals unity in the central region. The position at which the bar/gap ratio is unity can be checked, for each series X and Y, visually using a microscope. Thus, for the series X, the width of the bar I equals the width of the gap between the bars I and J; and, for the series Y, the width of the bar K equals the width of the gap between the bars K and L.

FIG. 2 shows the resultant pattern which is produced on the substrate after it has been subjected to photolith and etching processes. This resultant pattern shows the same linewidth variation (loss) as the desired pattern which is produced on the substrate. As before, this pattern has two series X' and Y' of spaced bars, each of which has the same width as the corresponding bar of the test pattern of FIG. 1 minus the linewidth loss L. Consequently the bars of series X' each have a width of $W^1-L$, and the gaps of series Y' each have a width of $G^2+L$. Then, by using a microscope, it is relatively easy to determine where in each series X' and Y' the bar/gap ratio is unity; and, from this, it is possible to calculate the linewidth loss L. For example, for the series X', if the bar/gap ratio unity point has moved n bars from its original position, then the width of the gap at the unity point will be given by:

$$G'_n = G'_o - ng$$

where $G'_o$ is the width of the gap at the central region of series X'; and $G'_n$ is the width of the gap at the nth bar away from the central region of series X'.

Now, $$G'_o = W^1 + L$$

as the gap width $G_o$ at the unity point of series X equals the bar width $W^1$, and linewidth is reduced by L in going from series X to series X', so that gap width is increased by L therefore $$G'_n = W^1 + L - ng$$

but, at the unity point of series X', the gap width is equal to the bar width namely:

$$G'_n = W^1 - L$$

therefore
$W^1 + L - ng = W^1 - L$
therefore $2L = ng$
or $L = ng/2$

For example, where $g = 0.05$ μm and $n = 8$, $L = 0.2$ μm.

Similarly, for the series Y and Y', the linewidth loss L is given by:

$$L = (nw)/2$$

The provision of the complementary series having gaps of constant width helps to alleviate problems which might arise if the microscope is slightly out of focus.

In principle, therefore, the position of bar/gap equality can be recorded for each processing step, giving a record of linewidth variation from the mask throughout the complete processing procedure.

The method described above has a number of advantages when compared with known linewidth loss meaurement techniques. In particular, it is much easier and quicker than known methods, and it can be used for any type of substrate. Moreover, any type of metallurgical microscope can be used, and this gives scope for using better quality microscopes than can be used in the known methods (which are restricted to using image shearing microscopes or microscopes incorporating scales in their eye pieces).

The method described above could be modified in a number of ways. For example, in order to increase the range over which linewidth loss can be measured, further pairs of series of bars can be added. Typically two further pairs of series of bars can be used, in the first of which the bars of the X series each have a width of 2 μm and the gaps of the Y series each have a width of 2 μm, and in the second of which the bars of the X series each have a width of 4 μm and the gaps of the Y series each have a width of 4 μm. In this case, the increments g and w would be 0.1 μm and 0.2 μm respectively for the first and second additional series.

The linewidth loss measurement technique described above could also be used to calibrate a scanning electron microscope. Observation under the scanning detector microscope of such a bar pattern reproduced on a substrate, allows determination of the value of n where the bar/gap ratio is unity. Because the bar width on the original mask is known, the actual bar width being observed can be estimated.

We claim:

1. A method of measuring linewidth loss during the formation of microelectronic circuitry, the method comprising the steps of:
   (a) forming a test pattern comprised of a series of spaced bars on a photographic mask which is to be used to form a predetermined pattern on a substrate material, one of the bars or the gaps between the bars having the same predetermined width, and the other of the bars or the gaps having widths which differ incremently stepwise from one to the next, the series of bars being such that the ratio of the widths of one adjacent bar/group pair is unity;
   (b) inspecting the resultant pattern which is formed on the substrate as a complement of the test pattern;
   (c) noting the position where the bar/gap width ratio of the resultant pattern is unity; and
   (d) calculating the linewidth loss from a knowledge of the size of the incremental step and the position of the bar/gap width ratio unity point on the resultant pattern.

2. A method according to claim 1, wherein the bars of the series are arranged to have the same width.

3. A method according to claim 1, wherein the gaps between the bars of the series are arranged to have the same width.

4. A method according to claim 1, wherein the test pattern is constituted by first and second series of spaced bars, the bars of the first series having the same width, and the gaps between the bars of the second series having the same width.

5. A method according to claim 1, wherein the line width loss (L) is calculated using the formula $L = nd/2$ where d is the incremental step by which the bars or gaps differ and n is the number of bars between the unity point of the bar/gap width ratio of the test pattern and the unity point of the bar/gap width ratio of the resultant pattern.

* * * * *